United States Patent [19]

Elliott

[11] Patent Number: 5,175,007
[45] Date of Patent: Dec. 29, 1992

[54] MOLD ASSEMBLY WITH SEPARATE ENCAPSULATING CAVITIES

[75] Inventor: Alexander J. Elliott, Mesa, Ariz.

[73] Assignee: Motorola, Inc., Schaumburg, Ill.

[21] Appl. No.: 705,860

[22] Filed: May 28, 1991

[51] Int. Cl.[5] .............................................. B29C 45/14
[52] U.S. Cl. ............................. 425/129.1; 264/272.14; 264/328.8; 425/130; 425/572; 425/573; 425/588
[58] Field of Search ...................... 264/272.11, 272.14, 264/328.15, 328.8; 425/127, 129.1, 130, 572, 573, 588

[56] References Cited

U.S. PATENT DOCUMENTS

| | | | |
|---|---|---|---|
| 4,368,168 | 1/1983 | Slepcevic | 264/272.14 |
| 4,513,942 | 4/1985 | Creasman | 264/272.14 |
| 4,837,184 | 6/1989 | Lin et al. | 264/272.11 |
| 4,863,665 | 9/1989 | Schad et al. | 264/328.15 |

Primary Examiner—Tim Heitbrink
Attorney, Agent, or Firm—Joe E. Barbee

[57] ABSTRACT

A duo-cavity multigang pot molding assembly (10) for encapsulating semiconductor devices having an annular cavity (11) to form a molded carrier ring and an inner cavity (12) adapted to receive the item to be encapsulated. An outer mold pot (16) provides encapsulating material for the annular cavity (11) whereas a separate mold pot (17) provides encapsulating material for the inner cavity (12). Encapsulating material for the mold pots (16, 17) may be the same or in a preferred embodiment, different. Molding apparatus (10) promotes improved process control by delivering encapsulating material with a lower and more uniform viscosity to both the annular cavity (11) and the inner cavity (12). Further, use of separate mold pots (16, 17) allows cost savings because a less expensive encapsulating material may be used for molding the molded carrier ring since a high purity encapsulating material is not needed.

4 Claims, 1 Drawing Sheet

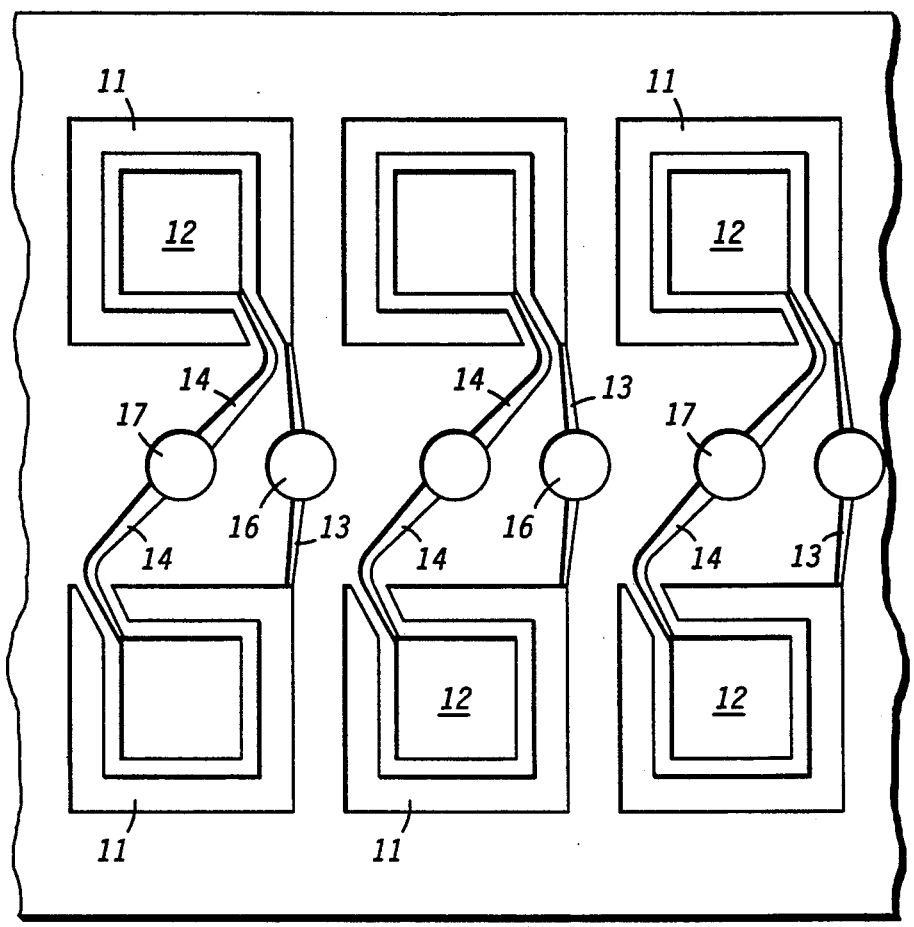
FIG. 1
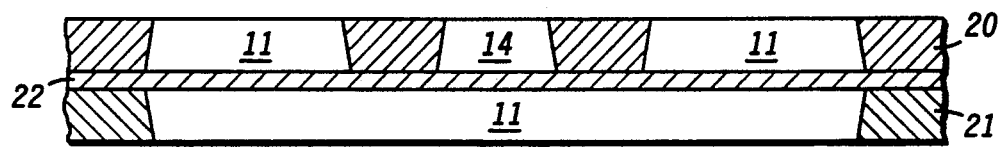
FIG. 2
FIG. 3
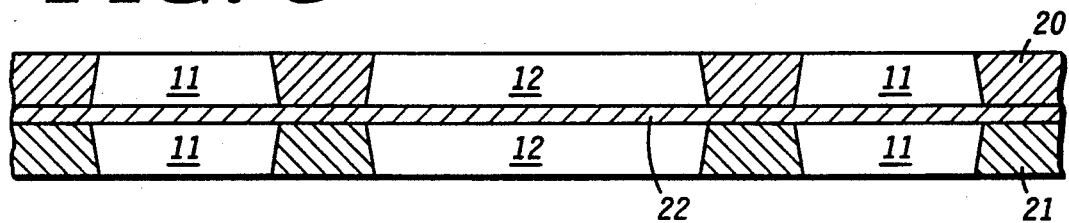

MOLD ASSEMBLY WITH SEPARATE ENCAPSULATING CAVITIES

BACKGROUND OF THE INVENTION

This invention relates, in general, to mold assemblies, and more particularly to a mold assembly wherein a molded carrier ring cavity and a device cavity are filled with different encapsulating materials.

Semiconductor manufacturers have used molding assemblies to encapsulate semiconductor devices for some time. Encapsulation or packaging serves to protect both the semiconductor device and the fragile signal interconnects from possible damage caused by interaction with elements in the environment. Further, some encapsulation techniques have included a molded carrier ring to protect the package during subsequent handling and testing.

Typically, a molding assembly has a plurality of cavities adapted to receive a semiconductor device. Cavities have been configured such that an annular cavity surrounds and is an extension of an inner cavity. The inner cavity receives the semiconductor device while the annular cavity serves to form the molded carrier ring. The molding assembly also has a receptacle, commonly called a pot, for receiving the encapsulating material. Some molding assemblies have more than one pot. The pot and cavity are connected by a runner through which encapsulating material flows.

In general, encapsulating material for semiconductor devices is a thermoset plastic which is inserted into the mold pot in a pelletized form. Under the influence of heat the pellet fuses, thereby attaining a liquid state. A ram or plunger forces fluidized encapsulating material to flow from the pot, through the runners, into the cavities; filling the annular cavity first followed by the inner cavity. Ideally, the encapsulating material remains in a liquid form until both inner and annular cavities are filled. Then, the encapsulating material returns to a solid form, a process commonly referred to as curing. However, it is known that curing begins during transfer of encapsulating material into the cavities, hence minimizing the transfer time is critical.

As an example, optimum encapsulation entails completion of fluidization and transfer of encapsulating material from pots to cavities before the material begins to cure. As the encapsulating material cures it becomes less fluidized, hence more viscous. The increased viscosity may cause encapsulating material to dislodge thin connecting wires on the semiconductor device upon entry into the inner cavity; a phenomenon commonly called wire sweep. Since fluidized encapsulating material is believed to cure as it flows toward the inner cavity, the distance from pots to cavities is critical, and generally has been minimized. Another cause of wire sweep may be that encapsulating material is injected under too high a pressure. Furthermore, lack of fluidization of encapsulating material may cause voids, which also compromises the integrity of the encapsulation. Multipot molds have been used in an attempt to overcome some of the problems of a single-pot mold; however, very high pressures are required in order to obtain good encapsulation. Accordingly, it would be beneficial to have a mold pot-cavity configuration that minimizes the length of runners as well as optimizes the expense of encapsulating material.

SUMMARY OF THE INVENTION

Briefly stated, the present invention has a duocavity mold assembly comprising separate mold pots which provide a different encapsulating material to the cavities. A first mold pot is connected to a first or inner cavity, and a second mold pot is connected to a second or annular cavity. The annular cavity forms a molded carrier ring and surrounds the inner cavity adapted to receive a semiconductor device. Each cavity is connected to a molding pot by a runner, through which encapsulating material flows. Each molding pot receives a pellet of encapsulating material wherein the molding pot connected to the inner cavity receives encapsulating material of higher purity than the molding pot connected to the annular cavity.

BRIEF DESCRIPTION OF THE DRAWINGS

FIG. 1 is a pictorial representation of a plan view of a mold assembly in accordance with the present invention;

FIG. 2 is a cross-sectional side view of a portion of the mold assembly of FIG. 1 illustrating the configuration of the inner cavity runner and the annular cavity; and FIG. 3 is a cross-sectional side view of a portion of the mold assembly of FIG. 1 illustrating the configuration of the annular and inner cavities.

DETAILED DESCRIPTION OF THE DRAWINGS

FIG. 1 is a pictorial representation of a duocavity multigang pot mold assembly 10. As illustrated, mold assembly 10 has six sets of duo-cavities. An annular cavity 11 forms the molded carrier ring and surrounds an inner cavity 12 in which the item to be encapsulated is located. In a preferred embodiment, the item to be encapsulated within inner cavity 12 is a semiconductor device. The molded carrier ring formed by annular cavity 11 is a structure whose function is to protect the integrity of the package, but which is eventually discarded, whereas inner cavity 12 forms the encapsulating package and remains an integral part of the final product. An outer molding pot 16 is connected to annular cavity 11 by a chase or runner 13. In addition, an inner molding pot 17 is connected to inner cavity 12 by a chase or runner 14 which is different from runner 13. Each outer molding pot 16 is connected to two annular cavities 11 by runners 13, and each inner molding pot 17 is connected to two inner cavities 12 by runners 14. It will be understood that duo-cavity multigang pot molding assembly 10 is illustrated as an example only and not as a limitation to the present invention. In other words, the number of cavities or pots on a molding assembly is not limited by the present invention.

Typically, a pelletized first encapsulating material is placed in outer mold pot 16 for heating, and subsequent fluidization and injection into annular cavity 11 to form the molded carrier ring. Likewise, a pelletized second encapsulating material is placed in inner mold pot 17 for heating, and subsequent fluidization and injection into inner cavity 12. Further, inner molding pot 17 is used with pellets of higher purity than outer molding pot 16. The higher purity of encapsulating material for inner cavity 12 is essential to protect the integrity of the semiconductor device and its electrical characteristics. In a preferred embodiment, the mold characteristics of the encapsulating materials are similar, and in particular the mold compound for the annular cavity 11 is MP180B, manufactured by Nitto, and that of inner cavity 12 is KE600, manufactured by Toshiba. Since the KE600 compound is of higher quality it is much more expensive than the MP180B. Since the molded carrier ring consumes approximately 43 percent of the total molding compound, a monetary savings is realized by using a less expensive mold compound for the molded carrier ring.

Mold assembly 10 is maintained at a temperature which will fluidize the encapsulating material. In addition, each molding pot 16, 17 is connected to a ram or plunger (not shown) for injecting the fluidized encapsulating material into appropriate cavities 11, 12, respectively. In a preferred embodiment, the rams are joined together to facilitate simultaneous transfer of encapsulating material from molding pots 16,17 to cavities 11,12, respectively. The ram or plunger (not shown) forces the fluidized encapsulating material to flow through the respective runners 13,14 into the appropriate cavities 11 12.

FIG. 2 is a cut-away side view of a portion of the mold assembly of FIG. 1 and includes annular cavity 11 and runner 14 of inner cavity 12. The mold assembly 10 comprises a top half 20 and a bottom half 21 which are adapted to form cavities. Inserted between the mold halves is a lead frame 22. Lead frame 22 cooperates with the mold assembly to channel the encapsulating material; thereby maintaining separate annular and inner cavities 11 and 12, respectively. Lead frame 22 prevents the encapsulating material flowing through runner 14 from entering the bottom half of annular cavity 11. The halves of the mold assembly are tightly clamped together such that flashing does not occur. Runner 14 is surrounded by and isolated from annular cavity 11. Runner 14 functions as a conduit directing encapsulating material from inner molding pot 17 (shown in FIG. 1) to inner cavity 12 (FIG. 1). This arrangement of upper mold half 20 and lower mold half 21 cooperating with lead frame 22, to maintain the integrity of runner 14, ensures the continuity of the bottom portion of the molded carrier ring in the vicinity of runner 14.

FIG. 3 is a cut-away side view of a portion of the mold assembly of FIG. 1 and includes annular cavity 11 and inner cavity 12. The top half 20 and the bottom half 21 of the mold assembly form the annular cavity 11 and inner cavity 12. Lead frame 22 is inserted between the two mold halves. Inner cavity 12 is adapted to receive an item which is subsequently encapsulated when the inner cavity is filled with encapsulating material. Annular cavity 11 forms a molded carrier ring which surrounds and protects the package housing the encapsulated item. In a preferred embodiment, the item to be encapsulated within inner cavity 12 is a semiconductor device. Annular cavity 11 and inner cavity 12 are separate, nonintersecting structures, such that the encapsulating material of inner cavity 12 does not come in contact with the encapsulating material of annular cavity 11.

By now it should be appreciated that there has been provided an improved molding assembly which has cavities adapted to receive different encapsulating materials. The annular cavity is separated from the inner cavity runner by a lead frame and receives encapsulating material from a different molding pot than the inner cavity. An improvement in process control is brought about by the duo-cavity multigang pot mold structure because of a decrease in both the viscosity and the viscosity variations of the encapsulating material entering the cavities. In addition, the duo-cavity multigang pot molding assembly promotes a cost savings by allowing the use of a less expensive encapsulating material for the molded carrier ring, which is eventually discarded.

I claim:

1. A duo-cavity multigang pot mold apparatus for encapsulating a semiconductor device and forming a molded carrier ring, which comprises:

a first half separated from a second half by a lead frame, wherein the first half, the second half, and the lead frame cooperate to form an inner cavity for receiving the semiconductor device and an annular cavity for forming the molded carrier ring wherein the annular cavity surrounds the inner cavity;

a first mold pot adapted to receive a primary encapsulating material to be injected into the inner cavity;

a second mold pot adapted to receive a secondary encapsulating material to be injected into the annular cavity;

a first runner coupling the first mold pot to the inner cavity, wherein a portion of the lead frame separates the first runner from the annular cavity at a location at which a portion of the first runner crosses the annular cavity; and a second runner coupling the second mold pot to the annular cavity.

2. The duo-cavity mold apparatus of claim 1 herein the first half of the mold apparatus forming the annular cavity includes a gap through which the first runner is formed, and the second half of the mold apparatus forming the annular cavity is a single continuous structure.

3. A mold for molding an encapsulating material around a semiconductor device, comprising:

a first mold cavity to receive the semiconductor device;

a second mold cavity surrounding the first mold cavity to form a molded carrier ring around the semiconductor device, wherein the first and second mold cavities are arranged to prevent an encapsulating material from flowing between the first and second cavities;

a first mold pot coupled to the first mold cavity by a first runner wherein a portion of the first runner is vertically separated from the second mold cavity by a lead frame and laterally spaced between two portions of the second mold cavity, the lead frame preventing the encapsulating material flowing through the first runner from entering the second mold cavity; and a second mold pot coupled to the second mold cavity by a second runner.

4. The mold for molding an encapsulating material around a semiconductor device of claim 3 wherein a portion of the second mold cavity opposite the first runner is a unitary cavity.

* * * * *